US012707574B2

(12) United States Patent
Lu

(10) Patent No.: US 12,707,574 B2
(45) Date of Patent: Aug. 11, 2026

(54) ELECTRONIC DEVICE AND SECURITY DEVICE

(71) Applicant: QISDA CORPORATION, Taoyuan City (TW)

(72) Inventor: Jen-Kai Lu, Taoyuan City (TW)

(73) Assignee: QISDA CORPORATION, Taoyuan City (TW)

( * ) Notice: Subject to any disclaimer, the term of this patent is extended or adjusted under 35 U.S.C. 154(b) by 717 days.

(21) Appl. No.: 18/080,759

(22) Filed: Dec. 14, 2022

(65) Prior Publication Data

US 2023/0279700 A1 Sep. 7, 2023

(30) Foreign Application Priority Data

Mar. 2, 2022 (CN) ......................... 202210196732.7

(51) Int. Cl.
*H05K 5/02* (2006.01)
*H01H 9/22* (2006.01)
*H05K 1/02* (2006.01)

(52) U.S. Cl.
CPC ............. *H05K 5/0208* (2013.01); *H01H 9/22* (2013.01); *H05K 1/0275* (2013.01)

(58) Field of Classification Search
CPC ...... H05K 5/0208; H05K 1/0275; H01H 9/22; G06F 21/86; G06F 1/181; G06F 1/184
See application file for complete search history.

(56) References Cited

U.S. PATENT DOCUMENTS 5,905,446 A * 5/1999 Benore .............. G07C 9/00571 109/54
7,049,970 B2 5/2006 Allen et al.
7,671,276 B2 * 3/2010 Baker ...................... H04Q 1/10 361/679.01
8,487,768 B2 * 7/2013 Lee ...................... G08B 13/126 235/382
8,866,609 B2 * 10/2014 Chen .................. G06K 19/0775 340/572.9
2005/0088303 A1 * 4/2005 Allen ................... G08B 13/149 340/568.4
2009/0133610 A1 * 5/2009 Baker .................... H04Q 1/025 109/50
2013/0049964 A1 * 2/2013 Lee ........................ G09F 3/0335 340/572.1
2014/0210615 A1 * 7/2014 Chen .................. G06K 19/0775 340/539.13

* cited by examiner

*Primary Examiner* — Imani N Hayman
*Assistant Examiner* — Theron S Milliser

(57) ABSTRACT

An electronic device includes a first cover, a second cover and a security device. The second cover is mutually covered with the first cover. The security device is arranged between the first and second covers. The security device includes a security zone base, a main board, a hollow fixing column, a switch element and a locking component. The security zone base is arranged on the first cover. The main board is arranged on the first cover and covers the security zone base. The hollow fixing column is arranged to pass through the main board. The switch element is arranged on the security zone base and corresponds to the hollow fixing column. The locking component passes through the second cover and is locked and protrudes from the hollow fixing column. The locking component protrudes from one end of the at least one hollow fixing column and abuts against the switch element.

12 Claims, 5 Drawing Sheets

10

ELECTRONIC DEVICE AND SECURITY DEVICE

FIELD OF THE INVENTION

The present invention relates to an electronic device, and more particularly to an electronic device and a security device with a security protection mechanism for stored information.

BACKGROUND OF THE INVENTION

Generally, data processing equipment may store confidential data. For example, a credit card machine may stores confidential information such as payment of users. Therefore, data processing equipment should be designed to include security devices to detect tampering or unauthorized disassembly of the device. These security devices may be activated to access stored confidential data. When the data processing equipment is lost or stolen, if the thief cannot use the password or comply with other requirements to achieve normal access to the stored data, he or she may attempt to use other unconventional means to access the data, such as opening the casing.

In order to prevent the confidential data or personal information from being stolen, data processing equipment should be equipped with a security mechanism that immediately destroys the stored information once someone attempts to open the casing to access the data.

SUMMARY OF THE INVENTION

The present invention provides an electronic device and a security device. A security protection mechanism of a security circuit is activated as long as there is an action of loosening or destroying a locking component of the security device. At this time, a casing of the electronic device still remains in an assembled state, so that the electronic device has a security protection mechanism with higher sensitivity and better reliability in use.

The electronic device provided by the present invention includes a first cover, a second cover and a security device. The second cover is configured to mutually cover with the first cover. The security device is arranged between the first cover and the second cover. The security device includes a security zone base, a main board, a hollow fixing column, a switch element and a locking component. The security zone base is arranged on the first cover. The main board is arranged on the first cover and covers the security zone base. The hollow fixing column is arranged to pass through the main board. The switch element is arranged on the security zone base and corresponds to the hollow fixing column. The locking component passes through the second cover and is locked and protrudes from the hollow fixing column. The locking component protrudes from one end of the at least one hollow fixing column and abuts against the switch element.

In an embodiment of the present invention, the second cover is formed with a counter bore corresponding to the hollow fixing column.

In an embodiment of the present invention, the locking component includes a head and a body. The body is connected to the head. An outer wall of the body is formed with an external thread. The hollow fixing column has a hollow channel. An inner wall of the hollow channel is formed with an inner thread. Part of the outer thread of the body and the inner thread of the hollow channel are screwed with each other. The head is placed in the counter bore.

In an embodiment of the present invention, the security zone base includes a bottom plate and a security wall. A security circuit is formed on the bottom plate. The security wall is arranged on the bottom plate to enclose the security circuit. The main board, the security wall and the bottom plate form a closed space.

In an embodiment of the present invention, the security circuit is activated when the locking component abuts against the switch element.

In an embodiment of the present invention, the hollow fixing column includes a hollow cylinder and a reverse buckle piece. The reverse buckle piece is arranged around an edge of the hollow cylinder. The hollow cylinder is arranged to pass through the main board. The reverse buckle piece is abutted against one side of the main board facing the security zone base.

In an embodiment of the present invention, the aforementioned electronic device further includes a display module arranged on the first cover. The security device is arranged between the display module and the second cover.

The security device provided by the present invention includes a security zone base, a main board, a hollow fixing column, a switch element and a locking component. The main board is arranged to cover the security zone base. The hollow fixing column is arranged to pass through the main board. The switch element is arranged on the security zone base and corresponds to the at least one hollow fixing column. The locking component is locked and protrudes from the hollow fixing column. The locking component protrudes from one end of the hollow fixing column and abuts against the switch element.

The electronic device provided by the present invention includes a first cover, a second cover and a security device. The second cover is configured to mutually cover with the first cover. The second cover is formed with at least one counter bore. The security device is arranged between the first cover and the second cover. The security device includes a security zone base, a main board, at least one hollow fixing column, at least one switch element, and at least one locking component. The security zone base is arranged on the first cover. The security zone base includes a bottom plate and a security wall. A security circuit is formed on the bottom plate, and the security wall is arranged on the bottom plate to enclose the security circuit. The main board is arranged on the first cover and covers the security zone base. The main board, the security wall and the bottom plate form a closed space. The at least one hollow fixing column is arranged to pass through the main board and corresponding to the at least one counter bore. The at least one hollow fixing column includes a hollow cylinder and a reverse buckle piece. The reverse buckle piece is arranged around an edge of the hollow cylinder. The hollow cylinder is arranged to pass through the main board. The reverse buckle piece is abutted against one side of the main board facing the security zone base. The least one switch element is arranged on the security zone base and corresponding to the at least one hollow fixing column. The at least one locking component is passing through the second cover, locked and protruding from the at least one hollow fixing column. The at least one locking component protrudes from one end of the at least one hollow fixing column and abuts against the at least one switch element to activate the security circuit. The at least one locking component includes a head and a body. The body is connected to the head. An outer wall of the body is formed with an external thread. The at least one hollow fixing column has a hollow channel. An inner wall of the hollow channel is formed with an inner thread. Part of the outer thread of the body and the inner thread of the hollow channel are screwed with each other. The head is placed in the at least one counter bore.

A security device provided by the present invention includes a security zone base, a main board, at least one hollow fixing column, at least one switch element, and at least one locking component. The security zone base includes a bottom plate and a security wall. A security circuit is formed on the bottom plate, and the security wall is arranged on the bottom plate to enclose the security circuit. The main board is arranged to cover the security zone base. The main board, the security wall and the bottom plate form a closed space. The at least one hollow fixing column is arranged to pass through the main board. The at least one hollow fixing column includes a hollow cylinder and a reverse buckle piece. The reverse buckle piece is arranged around an edge of the hollow cylinder. The hollow cylinder is arranged to pass through the main board. The reverse buckle piece is abutted against one side of the main board facing the security zone base. The at least one switch element is arranged on the security zone base and corresponding to the at least one hollow fixing column. The at least one locking component is locked and protruding from the at least one hollow fixing column. The at least one locking component protrudes from one end of the at least one hollow fixing column and abuts against the at least one switch element to activate the security circuit. The at least one locking component includes a head and a body. The body is connected to the head. An outer wall of the body is formed with an external thread. The at least one hollow fixing column has a hollow channel. An inner wall of the hollow channel is formed with an inner thread. Part of the outer thread of the body and the inner thread of the hollow channel are screwed with each other.

In the security device of the present invention, the locking component passes through the second cover and is screwed together with the hollow fixing column on the main board, and one end of the locking component is abutted against the switch element. The security circuit is activated when the locking component abuts against the switch element. Once someone intends to disassemble the casing of the electronic device, the security protection mechanism of the security circuit is activated due to that the switch element is not pressed as long as there is an action of loosening or destroying the locking component thereby causing the locking component fails to abut against the switch element. At this time, the locking component is still in a mutually screwed state with the hollow fixing column, so that the electronic device has a security protection mechanism with higher sensitivity and better reliability in use.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
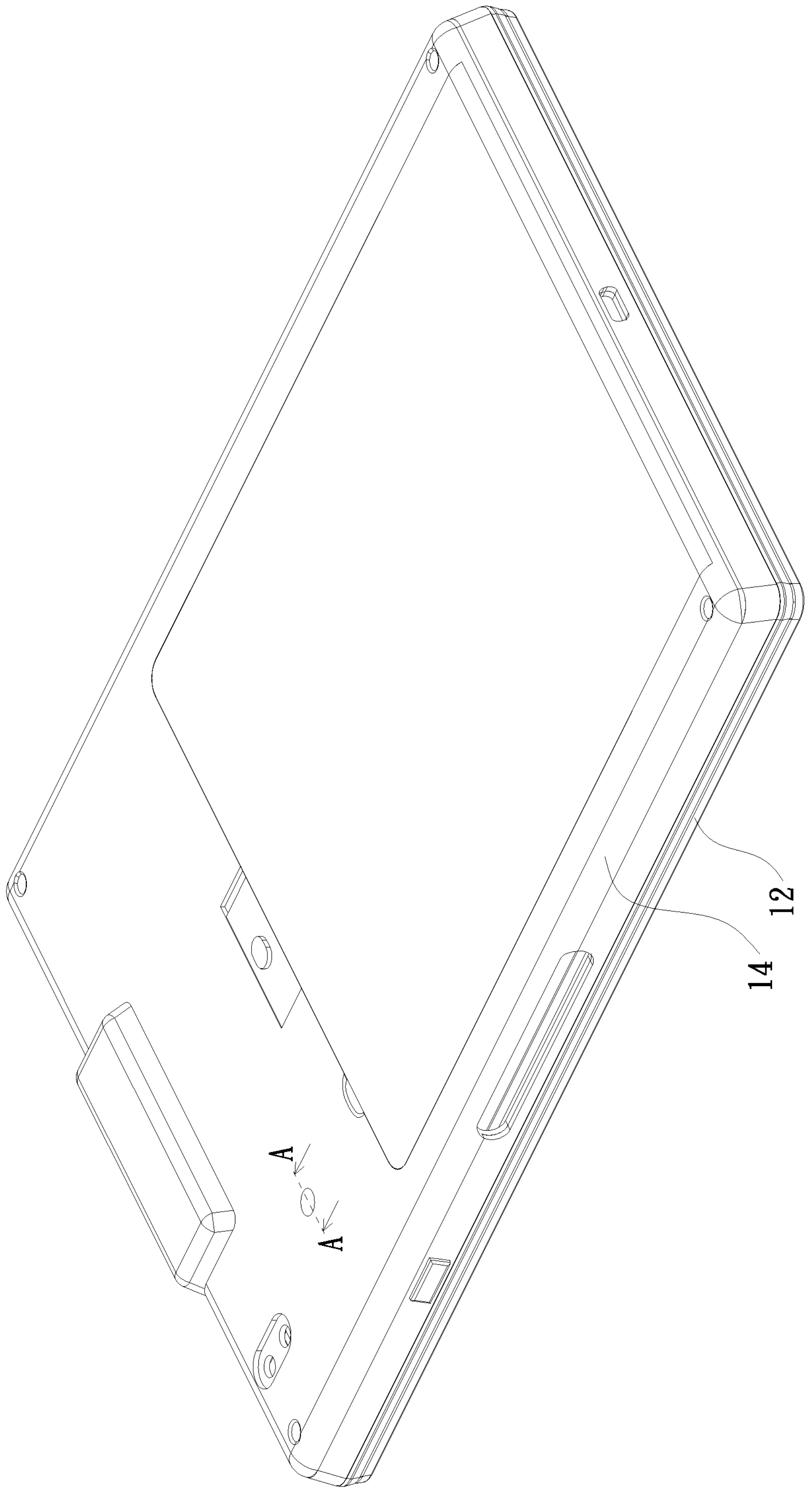
FIG. 1 is a schematic diagram of the appearance of an electronic device according to an embodiment of the present invention.
Figure 2:
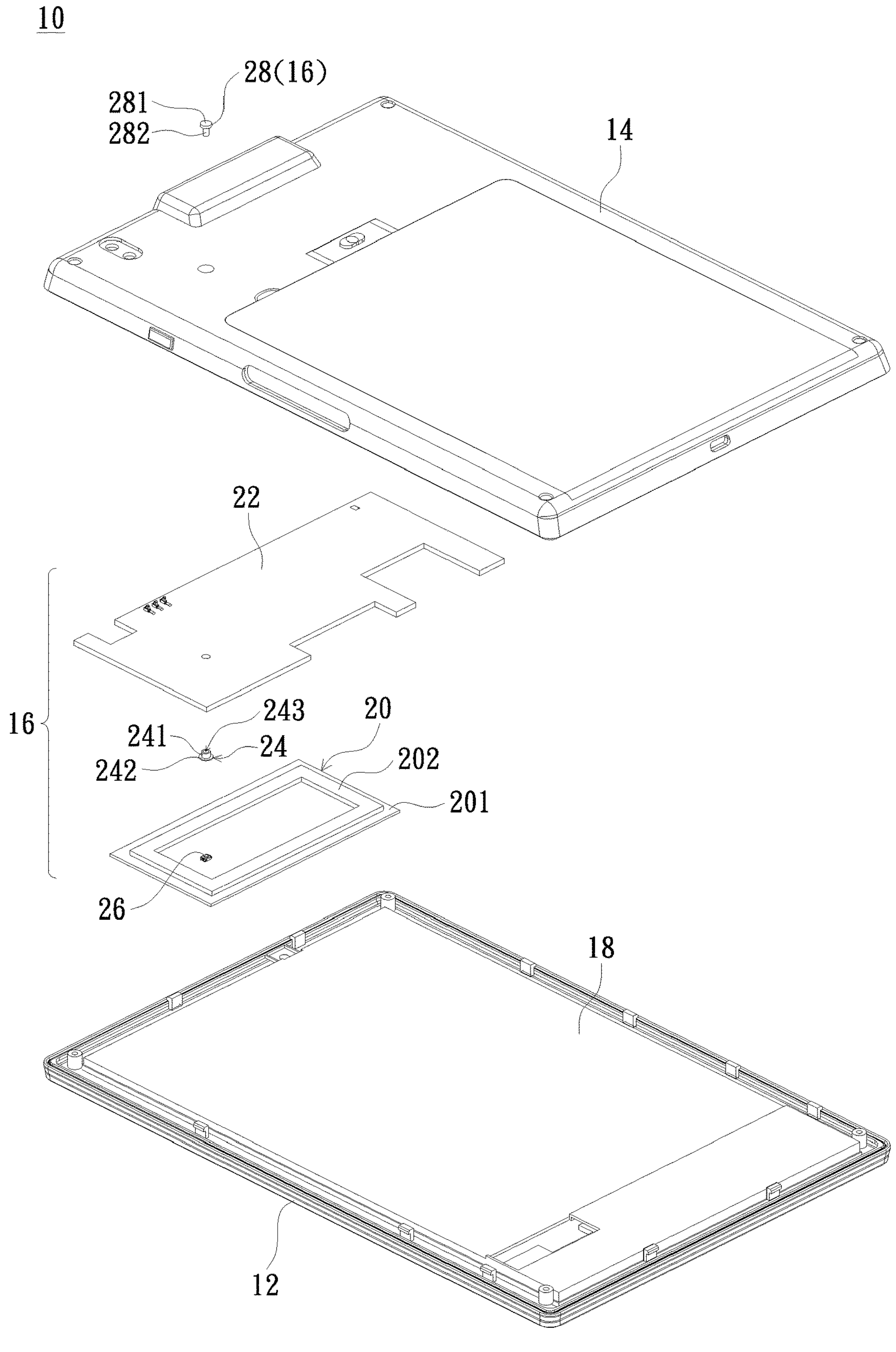
FIG. 2 is a schematic exploded perspective view of an electronic device according to an embodiment of the present invention.
Figure 3:
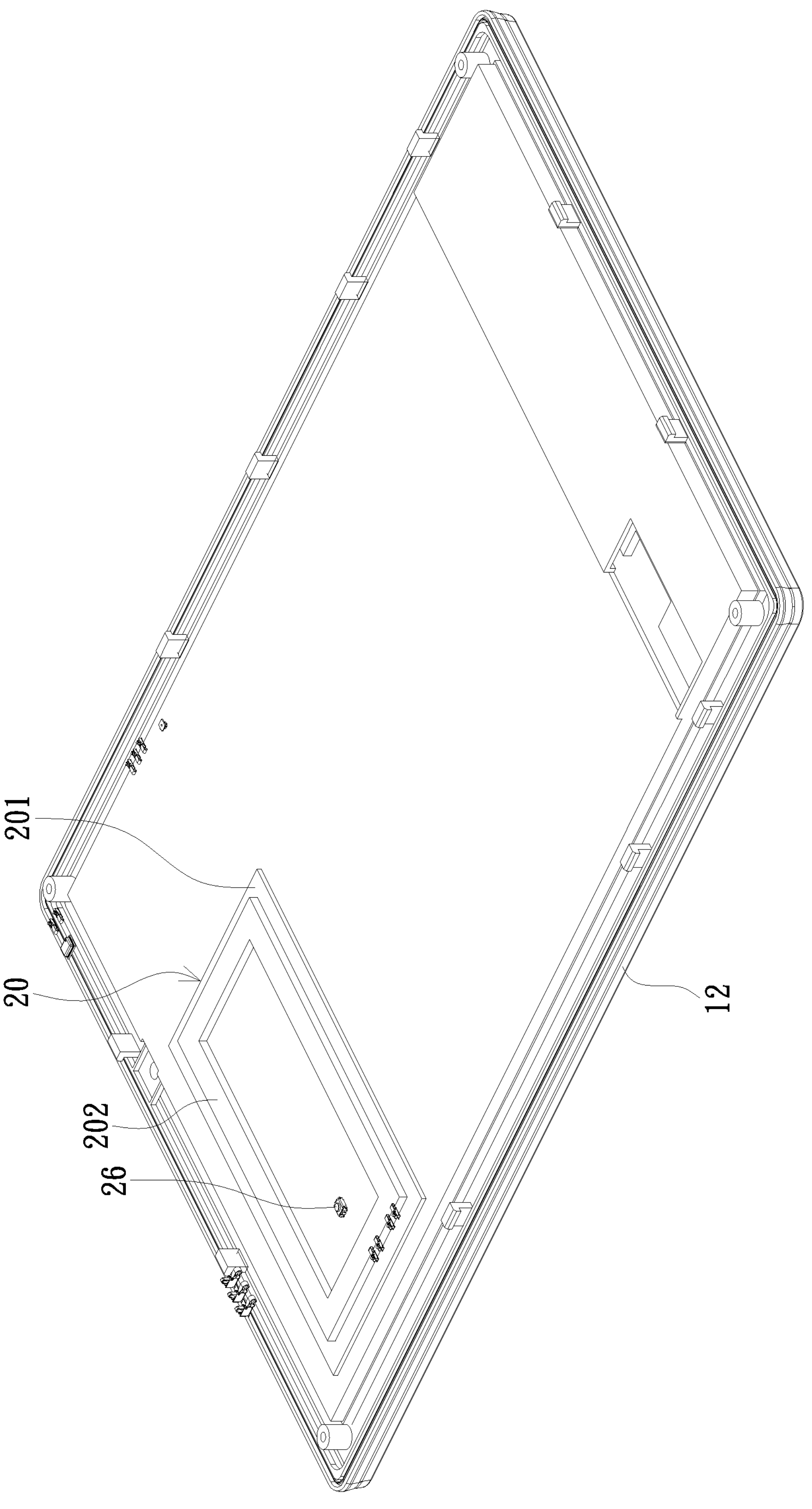
FIG. 3 is a schematic diagram of a partial assembly of an electronic device according to an embodiment of the present invention.
Figure 4:
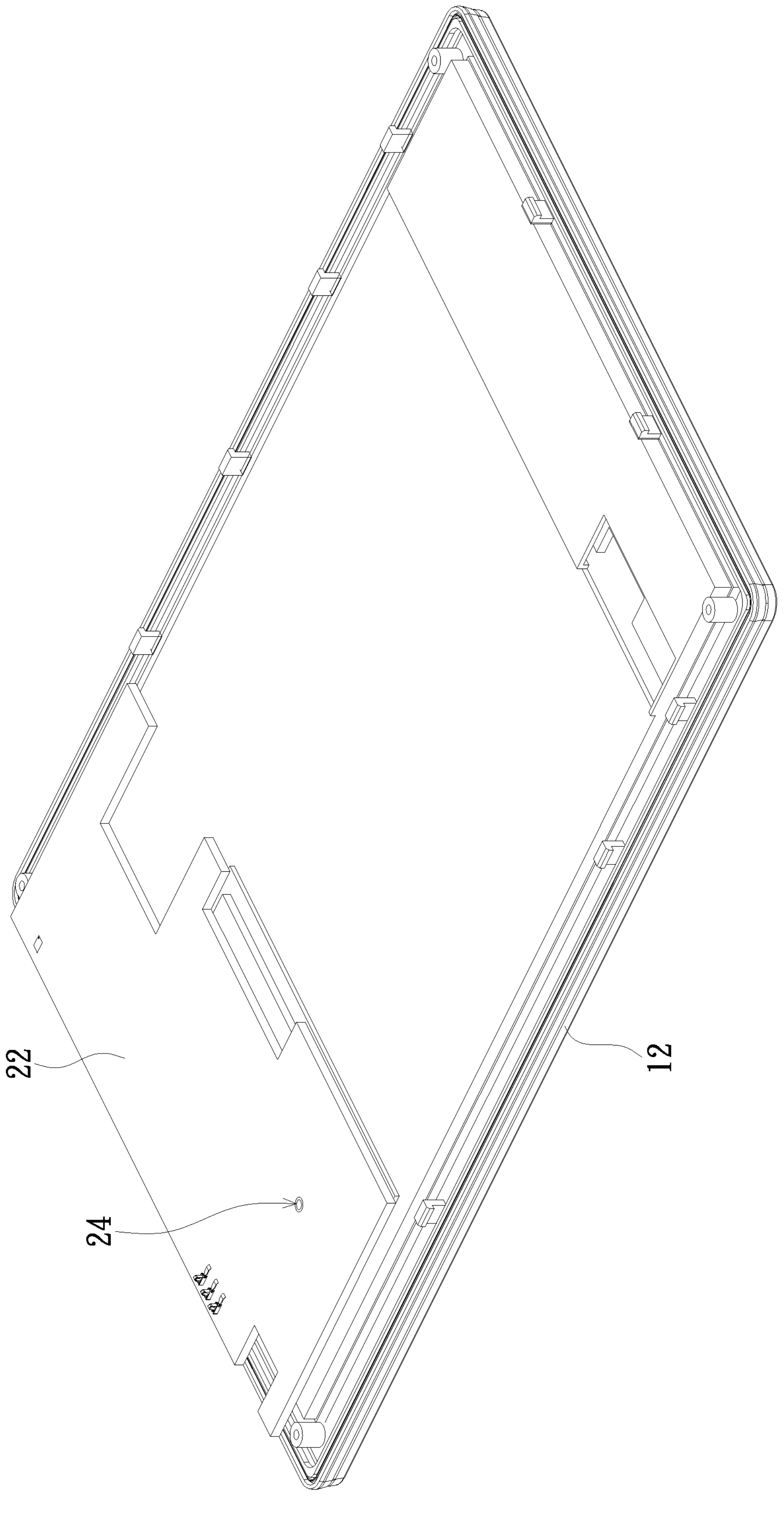
FIG. 4 is a schematic diagram of a partial assembly of an electronic device according to another embodiment of the present invention.

FIG. 1 is a schematic diagram of the appearance of an electronic device according to an embodiment of the present invention. FIG. 2 is a schematic exploded perspective view of an electronic device according to an embodiment of the present invention. FIG. 3 is a schematic diagram of a partial assembly of an electronic device according to an embodiment of the present invention. FIG. 4 is a schematic diagram of a partial assembly of an electronic device according to another embodiment of the present invention. As shown in FIGS. 1 and 2, the electronic device 10 includes a first cover 12, a second cover 14 and a security device 16. The second cover 14 is adapted to mutually cover with the first cover 12, and the security device 16 is arranged between the first cover 12 and the second cover 14. In one embodiment, the electronic device 10 is, for example, a card reader, and the electronic device 10 further includes a display module 18. The display module 18 is arranged on the first cover 12, and the security device 16 is arranged between the display module 18 and the second cover 14.

Continue the above description. As shown in FIGS. 2 and 3, the security device 16 includes a security zone base 20, a main board 22, a hollow fixing column 24, a switch element 26 and a locking component 28. The security zone base 20 is arranged on the first cover 12. In one embodiment, the security zone base 20 includes a bottom plate 201 and a security wall 202. A security circuit (not shown in the figure) is formed on the bottom plate 201, and the security wall 202 is arranged on the bottom plate 201 to enclose the security circuit. In one embodiment, the security wall 202 is, for example, in the shape of a rectangular frame. The switch element 26 is arranged, for example, on the security zone base 20 and is in contact with or electrically connected to the security circuit. In one embodiment, the security circuit is in a connected state when the switch element 26 is pressed, and the security circuit is in a disconnected state when the switch element 26 is not pressed.

Figure 5:
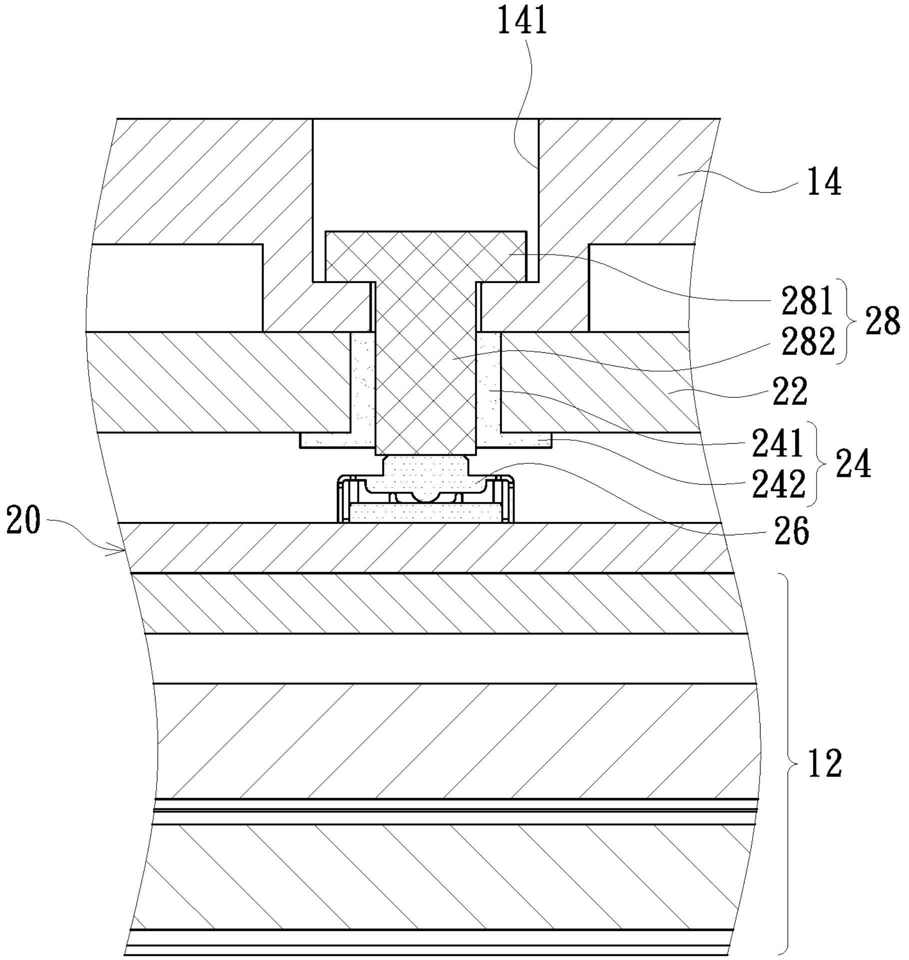
FIG. 5 is a schematic partial cross-sectional diagram of an electronic device according to an embodiment of the present invention.

Please refer to FIGS. 2 to 4 together. The main board 22 is arranged on the first cover 12 and covers the security zone base 20, so that a closed space is formed between the main board 22, the security wall 202 and the bottom plate 201. As shown in FIGS. 2 and 4, the hollow fixing column 24 is arranged to pass through the main board 22, and the position of the hollow fixing column 24 corresponds to the switch element 26 in the security zone base 20. In one embodiment, the hollow fixing column 24 includes a hollow cylinder 241 and a reverse buckle piece 242. The hollow cylinder 241 is, for example, a cylinder with a hollow channel 243. An inner wall of the hollow channel 243 is formed with an internal thread (not shown in the figure). The reverse buckle piece 242 is arranged around one edge of the hollow cylinder 241. FIG. 5 is a schematic cross-sectional view of the electronic device, taken along the line A-A in FIG. 1. In one embodiment as shown in FIG. 5, the hollow cylinder 241 is arranged to pass through the main board 22 from the side of the main board 22 facing the security zone base 20, and the reverse buckle piece 242 is abutted against the side of the main board 22 facing the security zone base 20.

Please refer to FIGS. 2 and 5 again. The locking component 28 included in the security device 16 passes through the second cover 14 and is locked and protrudes from the hollow fixing column 24. The locking component 28 is a screw in one embodiment. As shown in FIG. 5, the second cover 14 is formed with a counter bore 141. The counter bore 141 corresponds to the hollow fixing column 24 on the main board 22 when the second cover 14 and the first cover 12 are covered with each other. The locking component 28 includes a head 281 and a body 282 in one embodiment. The body 282 is connected to the head 281. An outer wall of the body 282 is formed with an external thread (not shown in the figure). The body 282 of the locking component 28 passes through the counter bore 141, and the external thread of the body 282 and the internal thread of the hollow channel 243 (labeled in FIG. 2) of the hollow fixing column 24 are screwed with each other. Specifically, the body 282 screwed together with the hollow channel 243 protrudes from one end of the hollow fixing column 24 and abuts against the switch element 26, and the head 281 of the locking component 28 is placed in the counter bore 141.

In the security device 16 of the embodiment of the present invention, the locking component 28 passes through the second cover 14 which is mutually covered with the first cover 12, and is screwed together with the hollow fixing column 24 on the main board 22, and one end of the locking component 28 is abutted against the switch element 26. In one embodiment, the security circuit on the security zone base 20 is activated when the locking component 28 abuts against the switch element 26. Once someone intends to disassemble the casing of the electronic device 10, that is, trying to separate the second cover 14 from the first cover 12, the security protection mechanism of the security circuit is activated due to that the switch element 26 is not pressed as long as there is an action of loosening or destroying the locking component 28 thereby causing the locking component 28 fails to abut against the switch element 26. In one embodiment, an action of destroying the stored information in the electronic device 10 is immediately performed when the security protection mechanism is activated. At this time, the locking component 28 is still in a mutually screwed state with the hollow fixing column 24, that is, the second cover 12 is still covered with the second cover 14 when the security protection mechanism is activated, so that the electronic device 10 has a security protection mechanism with higher sensitivity and better reliability in use. Further, in the security device 16, the hollow fixing column 24 is not easily pulled out from the main board 22 due to the design of the reverse buckle piece 242. Therefore, it is possible to further prevent the first cover 12 and the second cover 14 from being easily separated caused by the separation of the hollow fixing column 24 from the main board 22, thereby effectively improving the security protection of the electronic device 10.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic device, comprising:
- a first cover;
- a second cover, configured to mutually cover with the first cover; and
- a security device, arranged between the first cover and the second cover, and the security device comprising:
  - a security zone base, arranged on the first cover;
  - a main board, arranged on the first cover and covering the security zone base;
  - at least one hollow fixing column, arranged to pass through the main board;
  - at least one switch element, arranged on the security zone base and corresponding to the at least one hollow fixing column; and
  - at least one locking component, passing through the second cover, locked and protruding from the at least one hollow fixing column, wherein the at least one locking component protrudes from one end of the at least one hollow fixing column and abuts against the at least one switch element,
  - wherein the security zone base comprises a bottom plate and a security wall, a security circuit is formed on the bottom plate, the security wall is arranged on the bottom plate to enclose the security circuit, and the main board, the security wall and the bottom plate form a closed space,
  - wherein the at least one switch element is arranged on the bottom plate and surrounded by the security wall, and a portion of the at least one hollow fixing column is surrounded by the security wall.

2. The electronic device according to claim 1, wherein the second cover is formed with at least one counter bore corresponding to the at least one hollow fixing column.

3. The electronic device according to claim 2, wherein the at least one locking component comprises a head and a body, the body is connected to the head, an outer wall of the body is formed with an external thread, the hollow fixing column has a hollow channel, an inner wall of the hollow channel is formed with an inner thread, part of the outer thread of the body and the inner thread of the hollow channel are screwed with each other, and the head is placed in the counter bore.

4. The electronic device according to claim 1, wherein the security circuit is activated when the at least one locking component abuts against the at least one switch element.

5. The electronic device according to claim 1, wherein each of the at least one hollow fixing column comprises a hollow cylinder and a reverse buckle piece, the reverse buckle piece is arranged around an edge of the hollow cylinder, the hollow cylinder is arranged to pass through the main board, and the reverse buckle piece is abutted against one side of the main board facing the security zone base, wherein the reverse buckle piece of the at least one hollow fixing column is surrounded by the security wall.

6. The electronic device according to claim 1, further comprising a display module arranged on the first cover, wherein the security device is arranged between the display module and the second cover.

7. A security device, comprising:
- a security zone base, arranged on the first cover;
- a main board, arranged to cover the security zone base;

at least one hollow fixing column, arranged to pass through the main board;

at least one switch element, arranged on the security zone base and corresponding to the at least one hollow fixing column; and at least one locking component, locked and protruding from the at least one hollow fixing column, wherein the at least one locking component protrudes from one end of the at least one hollow fixing column and abuts against the at least one switch element, wherein the security zone base comprises a bottom plate and a security wall, a security circuit is formed on the bottom plate, the security wall is arranged on the bottom plate to enclose the security circuit, and the main board, the security wall and the bottom plate form a closed space, wherein the at least one switch element is arranged on the bottom plate and surrounded by the security wall, and a portion of the at least one hollow fixing column is surrounded by the security wall.

8. The security device according to claim 7, wherein the at least one locking component comprises a head and a body, the body is connected to the head, an outer wall of the body is formed with an external thread, the hollow fixing column has a hollow channel, an inner wall of the hollow channel is formed with an inner thread, and part of the outer thread of the body and the inner thread of the hollow channel are screwed with each other.

9. The security device according to claim 7, wherein the security circuit is activated when the at least one locking component abuts against the at least one switch element.

10. The security device according to claim 7, wherein each of the at least one hollow fixing column comprises a hollow cylinder and a reverse buckle piece, the reverse buckle piece is arranged around an edge of the hollow cylinder, the hollow cylinder is arranged to pass through the main board, and the reverse buckle piece is abutted against one side of the main board facing the security zone base, wherein the reverse buckle piece of the at least one hollow fixing column is surrounded by the security wall.

11. An electronic device, comprising:

a first cover;

a second cover, configured to mutually cover with the first cover, wherein the second cover is formed with at least one counter bore; and a security device, arranged between the first cover and the second cover, and the security device comprising:

a security zone base, arranged on the first cover, wherein the security zone base comprises a bottom plate and a security wall, a security circuit is formed on the bottom plate, and the security wall is arranged on the bottom plate to enclose the security circuit;

a main board, arranged on the first cover and covering the security zone base, wherein the main board, the security wall and the bottom plate form a closed space;

at least one hollow fixing column, arranged to pass through the main board and corresponding to the at least one counter bore, wherein the at least one hollow fixing column comprises a hollow cylinder and a reverse buckle piece, the reverse buckle piece is arranged around an edge of the hollow cylinder, the hollow cylinder is arranged to pass through the main board, and the reverse buckle piece is abutted against one side of the main board facing the security zone base, wherein the reverse buckle piece of the at least one hollow fixing column is surrounded by the security wall;

at least one switch element, arranged on the bottom plate of the security zone base, surrounded by the security wall, and corresponding to the at least one hollow fixing column; and at least one locking component, passing through the second cover, locked and protruding from the at least one hollow fixing column, wherein the at least one locking component protrudes from one end of the at least one hollow fixing column and abuts against the at least one switch element to activate the security circuit, wherein the at least one locking component comprises a head and a body, the body is connected to the head, an outer wall of the body is formed with an external thread, the at least one hollow fixing column has a hollow channel, an inner wall of the hollow channel is formed with an inner thread, part of the outer thread of the body and the inner thread of the hollow channel are screwed with each other, and the head is placed in the at least one counter bore.

12. A security device, comprising:

a security zone base, comprising a bottom plate and a security wall, wherein a security circuit is formed on the bottom plate, and the security wall is arranged on the bottom plate to enclose the security circuit;

a main board, arranged to cover the security zone base, wherein the main board, the security wall and the bottom plate form a closed space;

at least one hollow fixing column, arranged to pass through the main board, wherein the at least one hollow fixing column comprises a hollow cylinder and a reverse buckle piece, the reverse buckle piece is arranged around an edge of the hollow cylinder, the hollow cylinder is arranged to pass through the main board, and the reverse buckle piece is abutted against one side of the main board facing the security zone base, wherein the reverse buckle piece of the at least one hollow fixing column is surrounded by the security wall;

at least one switch element, arranged on the bottom plate of the security zone base, surrounded by the security wall, and corresponding to the at least one hollow fixing column; and at least one locking component, locked and protruding from the at least one hollow fixing column, wherein the at least one locking component protrudes from one end of the at least one hollow fixing column and abuts against the at least one switch element to activate the security circuit, wherein the at least one locking component comprises a head and a body, the body is connected to the head, an outer wall of the body is formed with an external thread, the at least one hollow fixing column has a hollow channel, an inner wall of the hollow channel is formed with an inner thread, and part of the outer thread of the body and the inner thread of the hollow channel are screwed with each other.

* * * * *